US010978125B1

(12) United States Patent
Mulaosmanović

(10) Patent No.: US 10,978,125 B1

(45) Date of Patent: Apr. 13, 2021

(54) TRANSISTOR WITH ADJUSTABLE RECTIFYING TRANSFER CHARACTERISTIC

(71) Applicant: NaMLab gGmbH, Dresden (DE)

(72) Inventor: Halid Mulaosmanović, Dresden (DE)

(73) Assignee: NAMLAB GGMBH, Dresden (DE)

( * ) Notice: Subject to any disclaimer, the term of this patent is extended or adjusted under 35 U.S.C. 154(b) by 0 days.

(21) Appl. No.: 16/853,949

(22) Filed: Apr. 21, 2020

(51) Int. Cl.
*G11C 11/22* (2006.01)
*H01L 29/78* (2006.01)
*H01L 29/51* (2006.01)

(52) U.S. Cl.
CPC ........ *G11C 11/223* (2013.01); *G11C 11/2275* (2013.01); *H01L 29/516* (2013.01); *H01L 29/78391* (2014.09)

(58) Field of Classification Search
CPC ... G11C 11/223; G11C 11/2275; G11C 11/22; H01L 29/516; H01L 29/78391
USPC ............................................ 365/145, 189.19
See application file for complete search history.

(56) References Cited

U.S. PATENT DOCUMENTS

2011/0224445 A1* 9/2011 Takimiya ............ H01L 51/0071 549/42
2011/0267872 A1* 11/2011 Toda .................... G11C 13/003 365/148
2014/0346442 A1* 11/2014 Nag ..................... B01J 13/0034 257/29
2017/0302185 A1* 10/2017 Tao ................... H02M 3/33592
2019/0051349 A1* 2/2019 Sandhu ................ G11C 14/009
2020/0035807 A1* 1/2020 Chen ................. H01L 29/78391
2020/0105195 A1* 4/2020 Song .................... G09G 3/3291
2020/0152618 A1* 5/2020 Sakamoto .............. G11C 16/30
2020/0212193 A1* 7/2020 Gosavi .............. H01L 29/78391
2020/0227515 A1* 7/2020 Shifren ............. H01L 29/40111
2020/0303417 A1* 9/2020 Teo ..................... G11C 11/2275
2020/0304118 A1* 9/2020 Tretter .................... H03G 3/004
2020/0309602 A1* 10/2020 El Fatimy ............. H01L 29/127
2020/0313000 A1* 10/2020 Uejima ............... H03F 3/45179
2020/0381510 A1* 12/2020 Arai ..................... H01L 29/0688
2020/0395499 A1* 12/2020 Ogawa ................ H01L 31/0288
2020/0402865 A1* 12/2020 Chen ..................... C23C 14/243
(Continued)

OTHER PUBLICATIONS

Shorubalko et al., A Novel Frequency-Multiplication Device Based on Three-Terminal Ballistic Junction, IEEE Electron Device Letters, vol. 23, No. & Jul. 2002, 3 pages.
(Continued)

*Primary Examiner* — Michael T Tran
(74) *Attorney, Agent, or Firm* — Dicke, Billig & Czaja, PLLC

(57) ABSTRACT

An integrated circuit element includes a gate, a source, and a drain. In response to a selected drain voltage, a drain-current-to-gate-voltage transfer characteristic of the integrated circuit element to transition from an asymmetric, non-linear first transfer characteristic to a non-linear parabolic-shaped second transfer characteristic with an inflection point having a corresponding inflection point gate voltage value, where drain current values of the second transfer characteristic increase in magnitude as gate voltage values both increase and decrease from the inflection point gate voltage value such that the second transfer characteristic is a rectifying transfer characteristic.

21 Claims, 20 Drawing Sheets

(56) References Cited

U.S. PATENT DOCUMENTS

2021/0005728 A1* 1/2021 Cheng ................ H01L 29/4234

OTHER PUBLICATIONS

Wang et al., A high-performance top-gate graphene field-effect transistor based frequency doubler, Appl. Phys. Lett 96, Dec. 8, 2009, 4 pages.
Wang et al., Graphene Frequency Multipliers, IEEE Electron Device Letters, vol. 30, No. 5, May 2009, 3 pages.
Wang et al., Graphene-Based Ambipolar RF Mixers, IEEE Electron Device Letters, vol. 31, No. 9, Sep. 2010, 3 pages.
Wang et al., Large Signal Operation of Small Band-Gap Carbon Nanotube-Based Ambipolar Transisttor: A High-Perfomance Frequency Doubler, NANO Letters, American Chemical Society 2010, 8 pages.
Yang et al., Triple-Mode Single-Transistor Graphene Amplifier and Its Applications, ACS Nano, vol. 4, No. 10, 7 pages.
Palacios et al., Applications of graphene devices in RF communications, Communications Magazine, IEEE 2010, 8 pages.
Ganjipour et al., Electrical properties of GaSb/InAsSb core/shell nanowires, IOP Science, Nanotechnology, Sep. 2014, 11 pages.

* cited by examiner

TRANSISTOR WITH ADJUSTABLE RECTIFYING TRANSFER CHARACTERISTIC

BACKGROUND

The present disclosure is related to electronic elements, circuits and devices, and in particular to frequency multiplier blocks.

Frequency multiplier blocks are commonly used in digital and analog communication systems, frequency synthesizers, terahertz radio astronomy and radiofrequency (RF) circuits. Frequency multiplication is achieved by feeding a sinusoidal input signal having an input frequency into a nonlinear element whose output contains a higher-order harmonic (a multiple) of the input frequency. To this purpose, Schottky diodes or field-effect transistors (FETs) are often employed. However, such devices generate not only the desired harmonic, but also additional harmonics which lead to a decrease of the frequency conversion efficiency. Moreover, such undesired harmonics need to be eliminated, where such elimination is achieved by employing accurate filtering circuits, thus increasing the complexity and the power consumption of the multiplier circuitry.

Alternative multiplication concepts for overcoming the aforementioned limitations have been proposed, which enhance the conversion efficiency by using particular non-linearities of the employed electronic medium. For instance, the ambipolar conduction of graphene and carbon nanotube FETs provide symmetric "V"-shaped transfer characteristics. By biasing such an element at a minimum conduction point, and by superimposing a sinusoid, an efficient frequency doubling may be achieved. However, graphene and CNT technologies have significant device- and system-level integration challenges which must be overcome in order to be competitive with the state-of-the-art silicon devices.

A Ferroelectric Field-Effect Transistor (FeFET) is a three or four terminal device, when considering gate, source and drain or gate, source, drain and bulk, respectively. When a certain class of ferroelectric materials (e.g. binary oxides, including hafnium and hafnium-zirconium oxide) is employed for the gate insulator, the FeFET is a fully CMOS compatible device providing fast read and write access times, low power consumption, and the possibility of accurate tuning of its switching properties and transfer characteristics.

SUMMARY

The present disclosure describes the rectifying behavior of an electrical device achieved by combining a non-linear transfer characteristic of the electrical device and a band-to-band tunneling in a contact region of the device. In one example, the present disclosure describes the rectifying behavior of an electrical device achieved by combining the non-linear transfer characteristic at positive gate voltages, and the band-to-band tunneling at a gate-to-drain overlap region at negative gate voltages.

In one example, such an electrical device is a transistor where the rectifying behavior is used for frequency multiplication or frequency mixing. In one example, a frequency multiplier based on a polarizable logic gate relying on unique symmetrical and rectifying properties of its transfer (I-V) curve is described.

In one example, the rectifying properties used for frequency multiplication are achieved by electrically tuning both a partial polarization switching of a polarizable material for a positive branch of the I-V characteristic, and band-to-band tunneling currents at a gate-drain overlap for a negative branch of the I-V characteristics. Based on this, frequency doubling of an input signal applied at the gate is achieved. Moreover, a multiplication mode can be selectively activated or suppressed depending on whether the polarization in the gate stack is up or down, respectively, such that the multiplication concept is fully reconfigurable.

In one example, a shape and symmetry of the transfer curve of the devices can be monotonically and arbitrarily tuned by electrical excitations. By shifting a threshold voltage of the device, the symmetry and width of a parabolic I-V transfer curve can be varied. In one example, the re-configurability of the device can be achieved either by setting a different threshold voltage and using a same dc bias, or by dc biasing at different operating points of the transfer curve and using a same threshold voltage. The re-configurability may be applied to different implementations.

In one example, by superimposing a sinusoidal signal of frequency $f_{in}$ to a dc bias for which the device is at a minimum conduction point, a drain current will display a signal whose fundamental frequency is double that at the input. Because of the rectifying behavior, both the positive and the negative input semi-cycle will result in positive drain current semi-cycles such that each semi-cycle swing of the input signal will correspond to a full-cycle swing of the output signal. Conversely, by changing the dc bias voltage to either the negative or the positive branch of the transfer characteristic, frequency doubling is precluded (switched off).

Additionally, in accordance with the present disclosure, the functionality of the polarizable material of the device is switched on or off depending of the polarization state of the polarizable material. By setting the device into one polarizable state, such as the low-$V_T$ state, or to another polarizable state, such as the high-$V_T$ state, and keeping the dc bias voltage constant, the rectifying behavior can be switched on or off such that the frequency doubling is made reconfigurable.

One example of a device described herein is implemented to provide binary frequency-shift keying, which is an example of the pervasively adopted frequency modulation technique used in telecommunication systems or for data processing. Polarizable logic gate-based frequency doublers, in accordance with the teachings of the present disclosure, provide simple building blocks which can significantly improve the design and power consumption of radiofrequency and communication circuits. Digital data can be encoded through discrete frequency changes, with each frequency representing a digit.

In other examples, a device as described herein may be applied to other digital modulation schemes which do not necessarily need to change the signal frequency. Phase-shift keying is one such scheme, where a phase of a carrier wave is modulated. In one example, a square wave data signal encoding 1s and 0s biases a polarizable device comprising a polarizable material at the negative and positive branch of the symmetric $I_D$-$V_G$ characteristics, resulting in two sinusoidal output signals having a phase difference of 180°. It is noted that such implementation is not limited to square data signals encoding 1s and 0s, but applies to data signal encoding and employing signal forms other than square wave signals.

The teachings of the present application may also be applied to frequency mixing, such as that used in wireless-communication systems. A symmetric $I_D$-$V_G$ shows predominantly even-order harmonics, whereas odd-order harmonics are attenuated. By introducing two sinusoidal inputs having distinct frequencies at the FeFET gate, a sum and a difference of the input signal frequencies, as well as other even-order harmonics, are achieved at the output signal.

In accordance with the present disclosure, according to one example, the polarizable device is a transistor having a drain and a polarizable material having at least two polarization states. In one example, the polarizable material is a ferroelectric, an anti-ferroelectric, a field-induced ferroelectric or a relaxor type ferroelectric material. In one example, the polarizable device is a FeFET.

In other examples, in addition to using Silicon-channel based FeFETs, a higher mobility channel (strained Si, SiGe or Ge), FinFET, multi-gate or gate-all-around structures or silicon-on-insulator (SOI) devices may be employed in accordance with the teachings of the present disclosure to boost the frequency needed for telecommunication systems or data processing.

DETAILED DESCRIPTION

The present disclosure describes a polarization-based logic gate including a transistor having a drain and a polarizable material having at least two polarization states, the polarization state representing a logic value used to reconfigurably tune a frequency multiplication. It is understood that the polarizable material may be a ferroelectric, an anti-ferroelectric, a field-induced ferroelectric or a relaxor type ferroelectric material. In one example, the polarization-based logic gate is a ferroelectric field-effect transistor (FeFET).

The gate oxide of a FeFET comprises a ferroelectric material or a series of dielectrics with a ferroelectric. The switching of the electric polarization in the ferroelectric by application of an external electric field can be used to tune the conductivity of the transistor channel and, therefore, its threshold voltage. The switching of the electric polarization can be accomplished by a single pulse (binary operation mode) and by applying a train of pulses, wherein the switching can be accomplished by changing the width and/or amplitude and/or sign of the pulses.

Figure 1A:
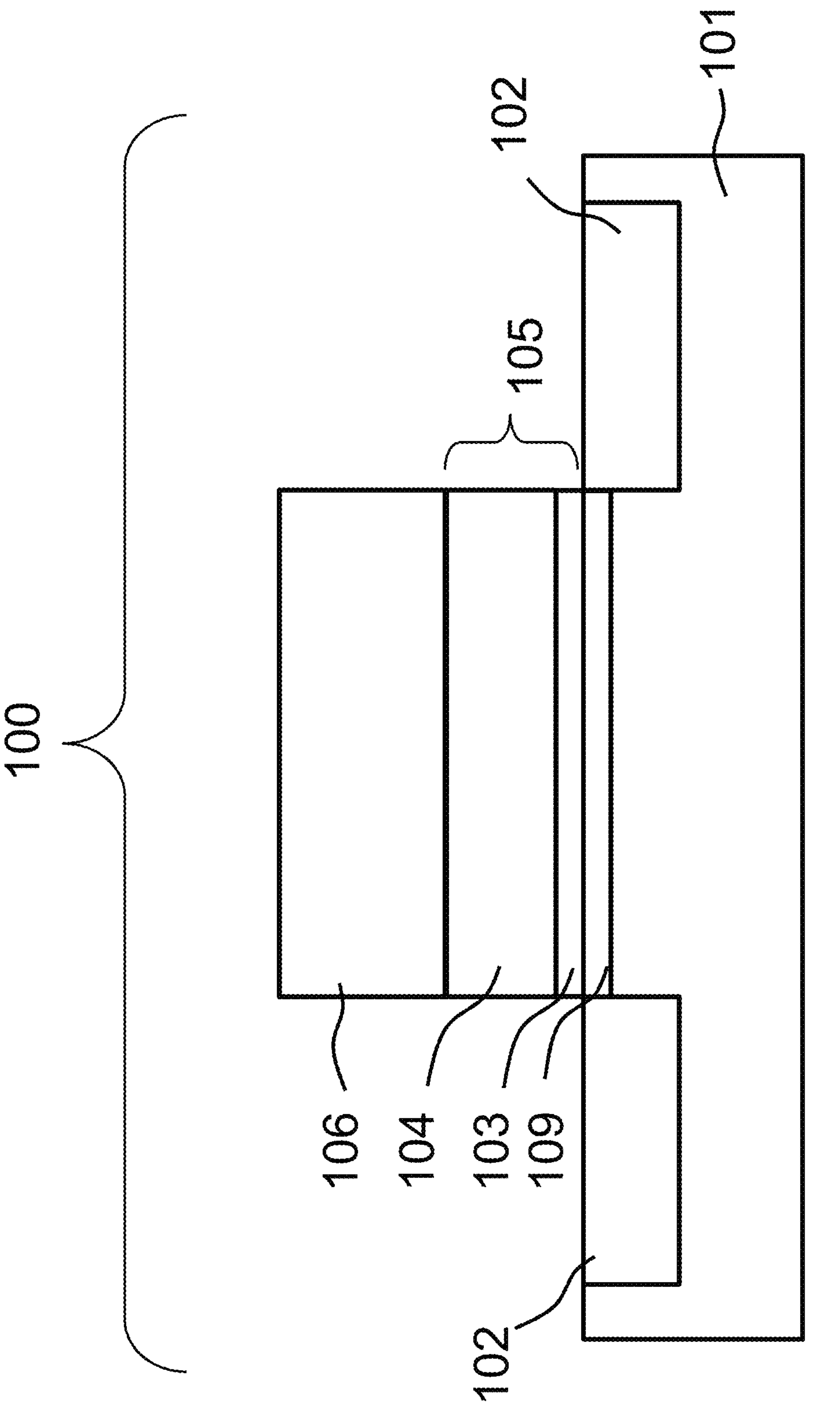
FIG. 1*a* depicts a cross-sectional view of an example of a metal ferroelectric insulator semiconductor (MFIS) structure.

The FeFET structure can be formed using, but is not limited to, a metal ferroelectric semiconductor (MFS) or a metal ferroelectric insulator semiconductor (MFIS) gate stack fabricated on a bulk semiconductor substrate (e.g. by means of high-k metal gate technology), such as depicted in FIG. 1*a*. The FeFET can also be formed in a fully-depleted silicon-on-insulator (FDSOI) technology, such as depicted in FIG. 1*b*.

FIG. 1*a* illustrates a cross-sectional view of an example MFIS structure 100 including a support structure 101 comprising a carrier material, such as a silicon compound. Other examples may employ SiGe, Ge, GaAs, GaN, InP as such a material. In one example, the supporting structure is a wafer. In some examples, the supporting structure or the wafer are made of more than one material, such as GaN on Silicon.

Adjacent to the surface of the support structure or the wafer, a channel (109) is formed. The channel is formed by doping with materials such as As, B or P in a Silicon based FeFET, or by hetero structures in GaN or GaAs based FeFETs forming a channel for a two dimensional electron gas (2DEG).

Figure 1B:
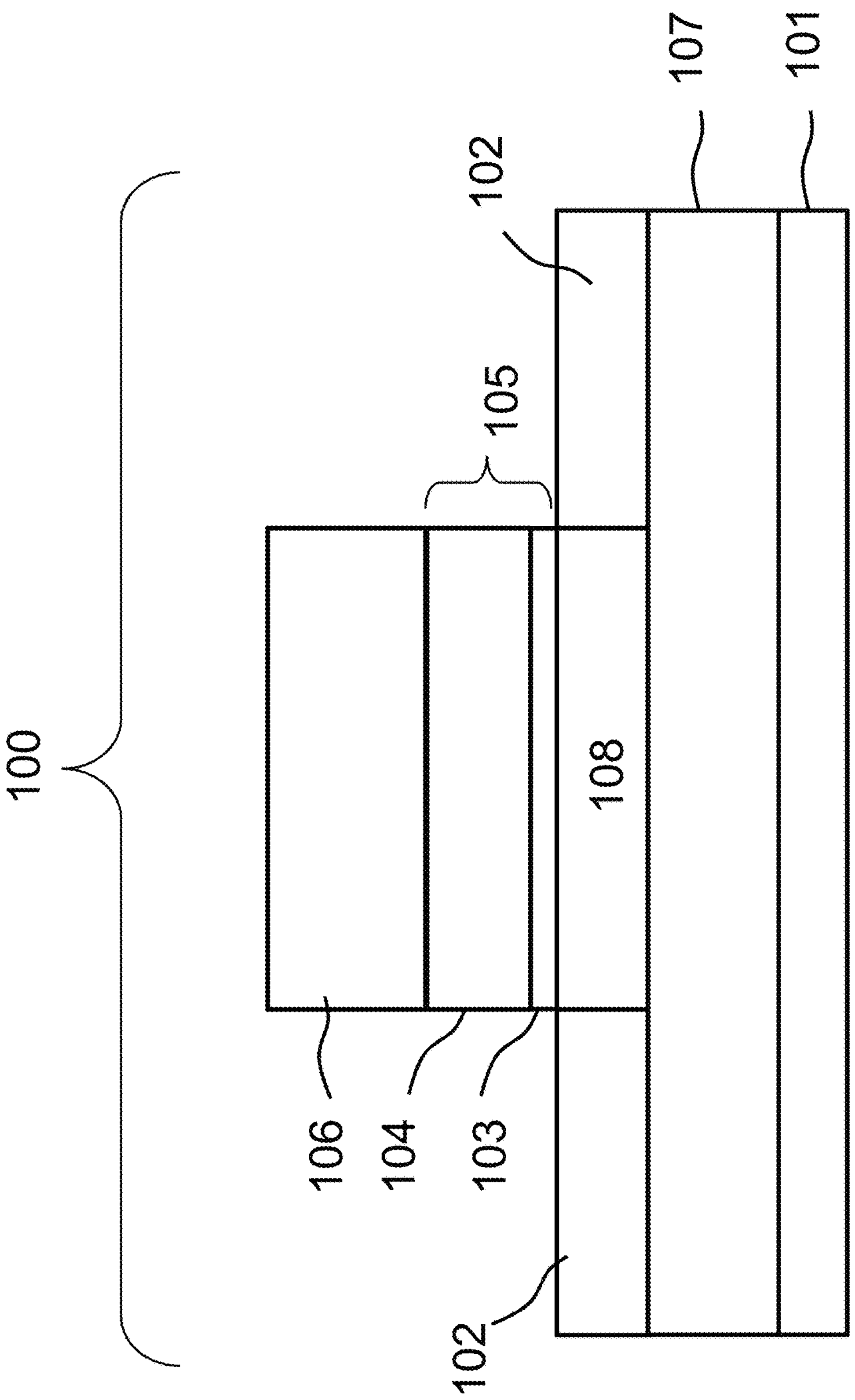
FIG. 1*b* depicts a cross-sectional view of an example of a metal ferroelectric insulator semiconductor (MFIS) structure on an SOI substrate.

FIG. 1*b* illustrates a cross-sectional view of an example of a MFIS structure 100 including a fully-depleted silicon-on-insulator (FDSOI) including a support structure 101 comprising a carrier material, such as a silicon compound. Other examples may employ SiGe, Ge, GaAs, GaN, InP as such a material. In one example, the supporting structure is a wafer. Adjacent to the support structure of the wafer, an isolating layer (107) is formed or deposited, sometimes referred to as a buried oxide layer including Silicon dioxide or any other suitable material.

Adjacent to isolating layer 107, a semiconductor layer (108) is formed. The semiconductor layer 108 comprises a channel adjacent to its surface of its upper part. The semiconducting layer is of Si, SiGe, Ge, GaAs, GaN, InP or of other materials of advantage concerning the application described herein.

In some examples, as described in FIG. 1*a* or FIG. 1*b*, an interfacial layer 103 may be formed over layer 101 or layer 108, which may include any number of suitable materials including, without limitation, $SiO_2$ or SiON or any other silicon containing material in case of Silicon based FeFETs.

A ferroelectric or anti-ferroelectric material layer 104 is formed over layer 103 or directly over the channel 109 (FIG. 1*a* and FIG. 1*b*). The term "ferroelectric material" or "anti-ferroelectric material", as used herein, refers to a material that is at least partially in a ferroelectric or anti-ferroelectric state or combinations of both states. For example, the ferroelectric or anti-ferroelectric material may comprise any of $HfO_2$, $ZrO_2$, any ratio of Hf and Zr combined with oxygen (e.g., $Zr_xHf_{1-x}O_2$, where x<1) as well as any combinations thereof or as main components The term "main components," as used herein, refers to any suitable number of O and any one or combinations of Hf, Zr and (Hf, Zr) per volumetric content, e.g., unit cell, that is higher as compared to other components or further additives introduced in any suitable manner into a ferroelectric or anti-ferroelectric material. If suitable additives are introduced to improve the ferroelectric or anti-ferroelectric material. Additives used are C, Si, Al, Ge, Sn, Sr, Pb, Mg, Ca, Sr, Ba, Ti and rare earth elements like Gd, La and Y.

Beside this other supporting layers are used if of advantage for the application as described. These layers are sacrificial layers to improve the crystallinity or the doping of the ferroelectric layer or interlayers realize layer stacks of more than one ferroelectric or anti-ferroelectric material. The ferroelectric or anti-ferroelectric material layer 104—and if existing—together with the interfacial layer 103 and other supporting layers form a layer stack 105.

A conductive layer 106, which indicates the gate contact of the transistor, can comprise any one or more suitable conductive metals including, without limitation, TiN, TaN, TaCN, WCN, Ru, Re, RuO, Pt, Jr, IrO, Ti, TiSi, TiAlN, TaAlN, W, WN, WSi, Ni, NiSi, Co, CoSi, Au, C, Si, Ge, SiGe and NbCN. It is to be understood that the material of the conductive layer might be chosen in a way such that the work-function of the respective material might influence the coercive voltage of the adjacent ferroelectric material oxide layer in a way, which is beneficial for the operation of the FeFET.

Conductive layers 102, which indicates the source/drain regions of the transistor are formed before, after or together with the ferroelectric layer. Conductive layers 102 may comprise any one or more suitable conductive metals including, without limitation, TiN, TaN, TaCN, WCN, Ru, Re, RuO, Pt, Jr, IrO, Ti, TiSi, TiAlN, TaAlN, W, WN, WSi, Ni, NiSi, Co, CoSi, Au, C, Si, Ge, SiGe and NbCN.

An example process for forming the MFIS structure of FIG. 1*a* is described as follows. A carrier structure 101 is provided that may comprise a Si (silicon) compound, such as SiGe (silicon-germanium) or silicon-on-insulator (SOI). It is noted that other semiconductor materials can also be provided as the carrier structure 101 including, e.g., III-V semiconductor compounds such as GaAs or any other suitable substrate material. The carrier structure 101 may have already been processed so as to include components and/or other devices already be formed within the carrier structure.

An interfacial layer 103 might be formed on the support structure 101 to improve the transistor channel to gate oxide interface quality, to reduce the number of charge traps, to prevent chemical reactions between the support structure 101 and the ferroelectric material oxide layer 104.

In each example implementation, layer 104 can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer including the ferroelectric material as described herein (i.e., oxygen and at least one of Hf and Zr). Any suitable number and types of precursors may be utilized to introduce elements such as Hf and Zr into the layer 104 utilizing any of the deposition techniques as described herein. The layer 104 is formed to have a suitable thickness, e.g., in the range from about 2 nm to 500 nm. In an example embodiment, the thickness range from layer 104 can be within the range from about 2 nm to about 15 nm.

In addition, the ferroelectric material oxide layer 104 can be formed to include, in addition to the ferroelectric material, dopants or further additives that may support the crystallization of the layer 104 into a state having ferroelectric properties. The additives can be included with the precursor materials, e.g., so as to be included during formation of the layer 104. Alternatively, the additives can be introduced into the formed layer 104 by ion implantation or any other suitable process. A concentration of the further additives within the layer may be set within a range from about 0.05 at % (atomic percent, as measured by ratio of additive atoms to ferroelectric material atoms) to about 30 at %, within a range from about 0.05 at % to about 10 at %, within a range from about 0.05 at % to about 5 at %, within a range from about 0.5 at % to about 3.5 at %, or a range from about 1 at % to about 3.5 at %. In general, the amount of the further additives may depend on the thickness of the layer 104. When increasing the thickness of the layer 104, the concentration of the further additives may also have to be increased to achieve a desired crystallization having ferroelectric properties.

Any suitable additives may be provided within the ferroelectric material oxide layer 104 including, without limitation, any one or more of C, Si, Al, Ge, Sn, Sr, Pb, Mg, Ca, Sr, Ba, Ti, Zr (e.g., providing Zr as an additive in a $HfO_2$ layer), Ti, and any one or more of the rare earth elements (e.g., Y, Gd, etc.). In particular, it has been determined that certain additives having an atomic radius that is about the same as or greater than Hf are particularly suitable as dopants for optimizing ferroelectric (FE) properties of the ferroelectric material oxide layer 104 when utilizing Hf in the layer. In contrast, certain additives having an atomic radius smaller than Hf can cause anti-ferroelectric (anti-FE) properties at phase boundaries between the monoclinic and tetragonal/cubic phases of $HfO_2$. It has further been determined that additives having an atomic radius about the same as or greater than Hf can be doped at larger ranges of concentrations within the ferroelectric material oxide layer in relation to other additives while still supporting FE properties of the ferroelectric material oxide layer. Other additives having the same valence as Hf can also be beneficial as dopants to reduce charge trapping characteristics of the ferroelectric material oxide layer by reducing open bonds within the $HfO_2$ host lattice of the layer.

Figure 1C:
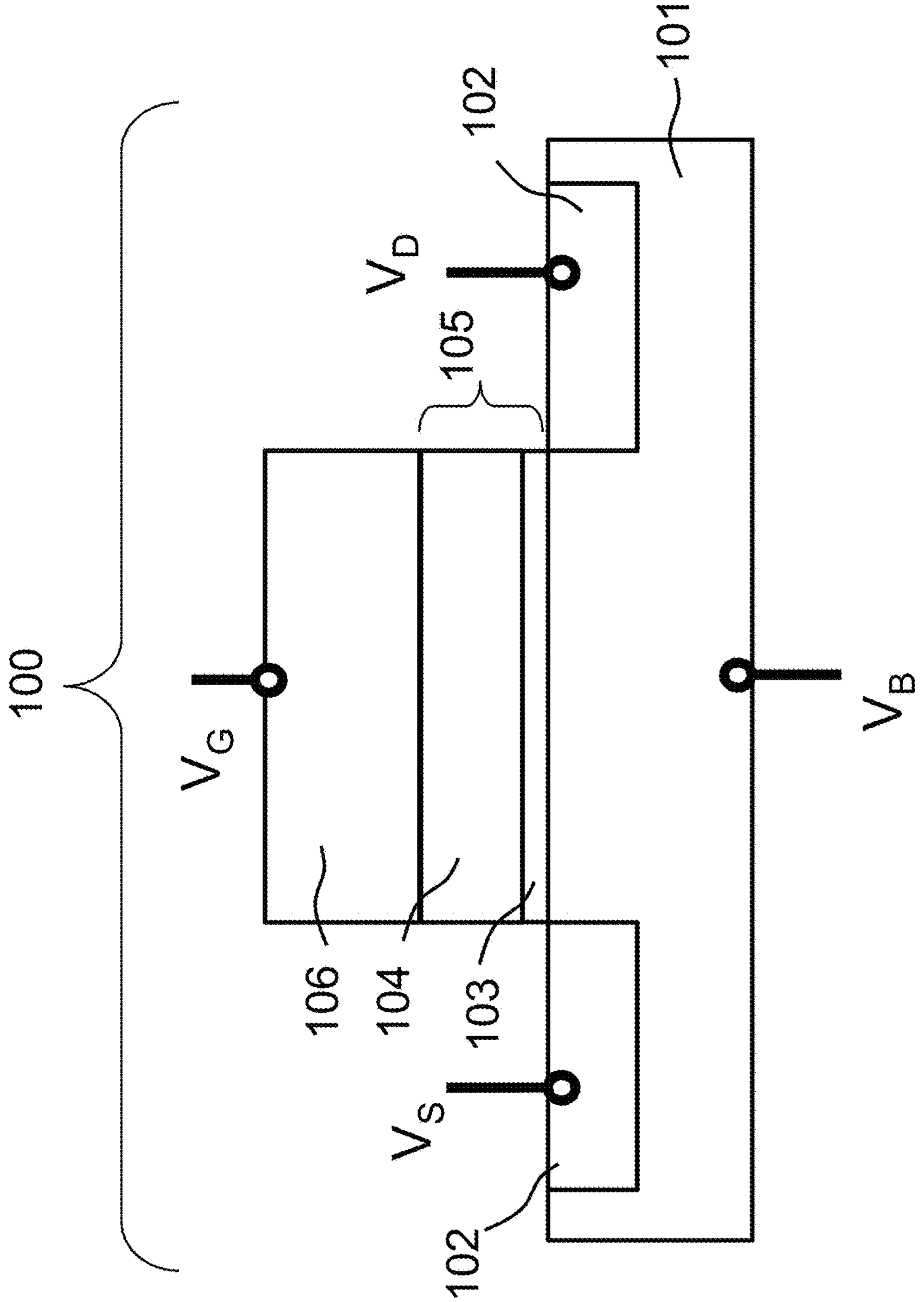
FIG. 1*c* depicts a cross-sectional view of an example of a metal ferroelectric insulator semiconductor (MFIS) structure, representing a FeFET structure where gate, source, drain and bulk terminals are connected to voltage sources, applying the voltages $V_G$, $V_S$, $V_D$ and $V_B$, respectively.

The conductive layer 106 for the embodiments of FIG. 1*a*, FIG. 1*b* and FIG. 1*c* can be formed utilizing any one of atomic layer deposition (ALD), metal organic atomic layer deposition (MOALD), chemical vapor deposition (CVD), metal organic chemical vapor deposition (MOCVD), physical vapor deposition (PVD), molecular beam epitaxy (MBE) deposition, Sol-gel or any other suitable deposition technique that facilitates formation of the layer. The conductive layer can be formed from any of the types of conductive materials as previously described for conductive layer 106, and the thickness of conductive layer 106 can be in the range of 1 nm to 10 nm or 1 nm to 300 nm.

The conductive layer 106 for the embodiments of FIGS. 1*a* and 1*b* provides a covering layer for the ferroelectric material oxide layer 104 and can also serve as a gate electrode for the implementation of the transistor.

In an alternative embodiment (not illustrated), a further covering layer can also be provided between the ferroelectric material oxide layer 104 and conductive layer 106. The further covering layer can be deposited prior to forming the conductive layer 106 utilizing any suitable deposition process such as any of the previously described processes, and the further covering layer can comprise any suitable materials such as $SiO_2$, $Al_2O_3$, $Sc_2O_3$, $Y_2O_3$, BaO, MgO, SrO, $Ta_xO_y$, $Nb_xO_y$, TiO, and lanthanum dioxides. The further covering layer may also be formed in a same deposition process with the second ferroelectric material oxide layer 104 by changing the supply of source/precursor materials during the deposition process (thus allowing the deposition to be performed within the same deposition chamber). For example, when forming the ferroelectric material oxide layer 104 from $HfO_2$, a precursor gas including oxygen may be continuously provided during deposition of the amorphous layer and the further covering layer. Hafnium precursor gas may be included with the oxygen precursor gas first in the deposition chamber to form the layer 104, where the hafnium precursor gas flow is then switched to a precursor gas flow (e.g., Si) to with the continuing flow of oxygen to form the further covering layer (e.g., $SiO_2$).

After the layers have been formed, an anneal process is carried out at one or more suitable temperatures and for one or more suitable time periods to achieve a suitable amount of crystallization for the ferroelectric material within the ferroelectric material oxide layer 104. In particular, the anneal process is carried out to heat the ferroelectric material oxide layer 104 to a temperature that is above the crystallization temperature of the ferroelectric material so as to at least partially alter its crystal state from amorphous to crystalline, thus resulting in a crystallized oxide within the ferroelectric material oxide layer 104. A Crystallization temperature may be chosen in a range of, e.g., from about 400° C. to about 1200° C. depending on the thermal budget of the used devices. A preferred crystalline temperature for the annealing process is at a temperature that is above the onset of crystallization for the ferroelectric material (when the ferroelectric material is amorphous, i.e., after the layer 104 is deposited and before annealing occurs) and is further greater than about 500° C., or at a temperature that is above the onset of crystallization for the ferroelectric material and is further greater than about 300° C. The time period for annealing can be from about 0.01 second to about 12 hours. These annealing temperature ranges induce partial crystallization of the ferroelectric material oxide layer 104 (e.g., crystallization to a suitable level within the layer 104 that is less than complete crystallization of the ferroelectric material).

The various layers 103, 104, 105, 106 of the structures 100 depicted in FIG. 1*a* and FIG. 1*b* can be patterned at any time after formation of the layers, either before or after the annealing process to crystallize the ferroelectric material oxide layer 103. The patterning of these layers are carried out as known for someone skilled in the art e.g. by an etch process using an etch mask. Any suitable spacer structures may also be formed (e.g., utilizing any suitable deposition technique. Any other further processing of the support structure or the wafer to integrate other components in relation to the support structure can be implemented before, after or together with the formation of the structure 100.

It is to be understood that the layer stack 105 can comprise a single ferroelectric material layer or, in other examples, can comprise a multitude of ferroelectric material layers, or in another embodiment can comprise additional conductive or isolating interfacial layers, separating the individual ferroelectric material layers.

It is further noted that MFIS structure 100 can also be formed with any one or more suitable geometries including, without limitation, planar or 3D geometry such as Trench MOSFET, FinFET, RCAT ("Recessed Channel Array Transistor"), TSNWFET ("Twin Silicon NanoWire Field Effect Transistor"), PiFET ("Partially insulated Field Effect Transistor"), McFET ("Multi-channel Field Effect Transistor").

It is further noted that the Source and Drain regions 102 of MFIS structure 100 can also be formed as metallic regions, thus forming a SFET ("Schottky-Transistor").

It is further noted that the Source and Drain regions 102 of MFIS structure 100 can also be formed with two different dopants species to form a TFET ("Tunneling Field Effect Transistor").

FIG. 1*c* depicts a cross-sectional view of an example of a metal ferroelectric insulator semiconductor (MFIS) structure as described in FIG. 1*a*, representing a FeFET structure where the gate, source, drain and bulk terminals are connected to voltage sources, applying the voltages $V_G$, $V_S$, $V_D$ and $V_B$, respectively.

Figure 2A:
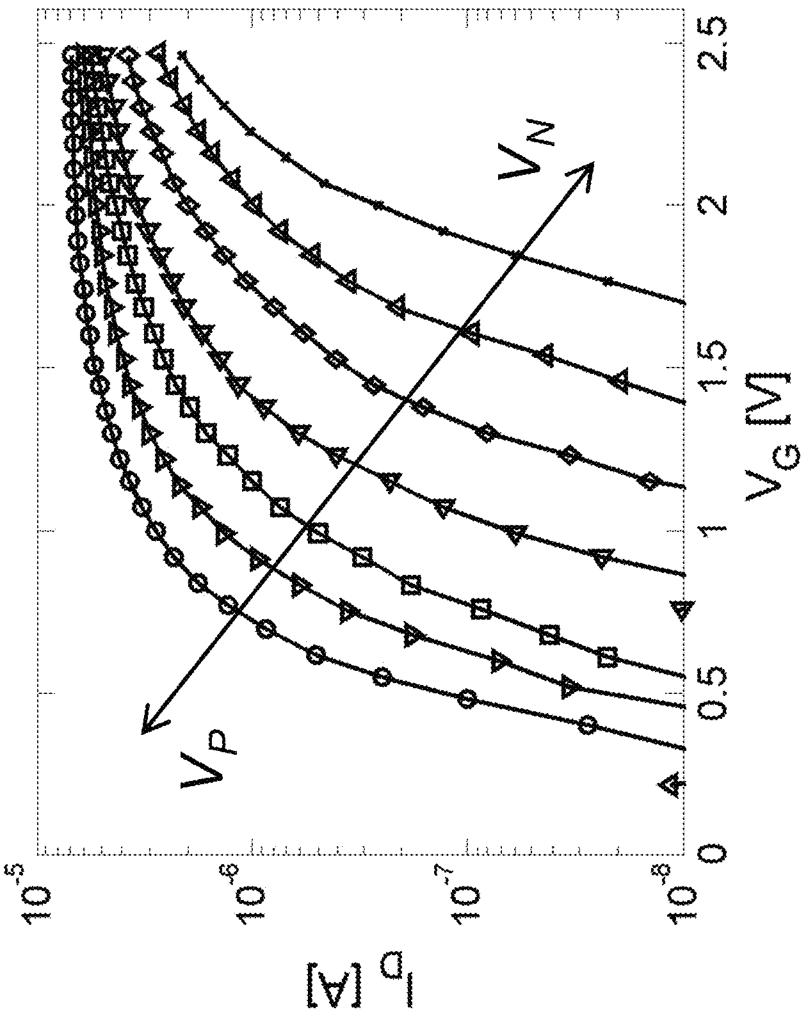
FIG. 2*a* illustrates a gradual shift of a transfer characteristics $I_D$-$V_G$ of a FeFET to lower threshold voltage ($V_T$) values upon positive $V_P$ pulses depicted in FIG. 2*b* or to higher $V_T$ values upon negative ($V_N$) pulses depicted in FIG. 2*c*.
Figure 2B:
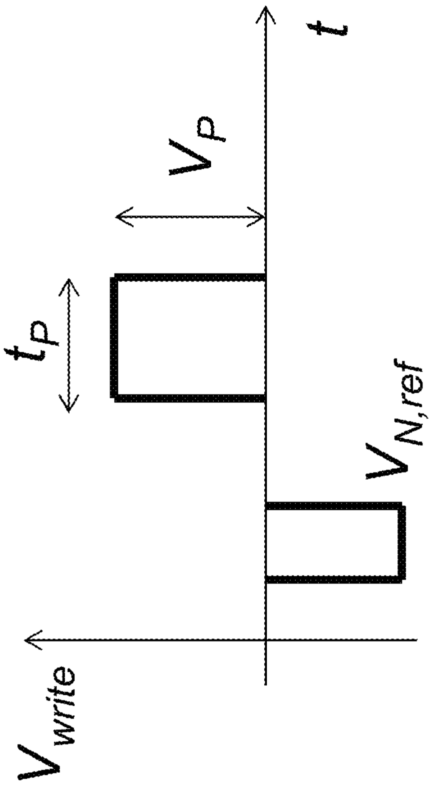
FIG. 2*b* depicts an example of a positive gate voltage pulse having an amplitude $V_P$ and width $t_P$, which is applied after a negative reset pulse, to achieve a decrease of the threshold voltage in a FeFET.
Figure 2C:
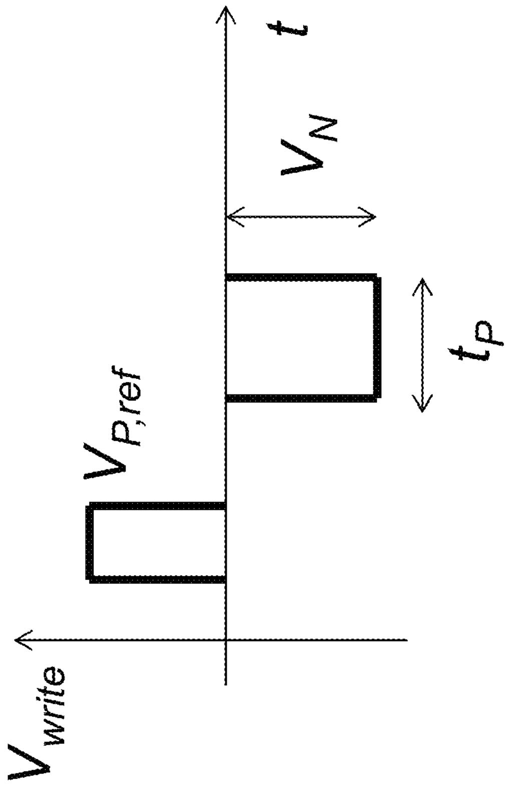
FIG. 2*c* depicts an example of a negative gate voltage pulse having an amplitude $V_N$ and width $t_P$, which is applied after a positive reset pulse, to achieve an increase of the threshold voltage in a FeFET.

FIG. 2*a* to FIG. 2*c* show an example of a gradual tuning of the threshold voltage ($V_T$) in a FeFET structure of FIGS. 1*a*, 1*b* and 1*c* under different gate voltage pulse $V_G$ schemes by means of the partial polarization switching in the FeFET's gate stack. The gate stack of the devices of the illustrated example includes a polysilicon/TiN gate electrode, 8 nm Si:$HfO_2$, ferroelectric gate material, a 0.8 nm SiON thick gate interface layer and Si as the substrate material. Around 4 mol % of silicon doping was introduced into $HfO_2$ during the deposition to induce the ferroelectric orthorhombic phase in the film after annealing. A two-step lithographic process defined the transistor lateral dimensions, i.e. 1 μm of channel width and 1 μm of channel length. The source and drain $n^+$ regions were obtained by phosphorous ion implantation, which were then activated by a rapid thermal annealing at around 1000° C. This anneal crystallized the ferroelectric layer as well.

It is understood that the I-V characteristic at positive gate voltages of the FeFET is optimized to get a symmetric I-V transfer characteristic of the device.

FIG. 2*b* shows one example of gate voltage pulses $V_G$ to be applied to a FeFET to decrease the $V_T$: the device is initially set into the high-$V_T$ state by a negative reference pulse ($V_{N,ref}$); then, a positive gate pulse amplitude $V_P$ is applied. As $V_P$ progressively increases, the FeFET's $V_T$ state monotonically decreases, as experimentally shown in FIG. 2*a*. Another example of gate voltage pulse $V_G$ scheme to monotonically decrease the $V_T$ state is to apply positive gate pulses with increasing pulse width $t_P$ and/or increasing number of positive pulses. FIG. 2*c* shows one example of gate voltage pulses to be applied to a FeFET to increase the $V_T$: the device is initially set into the low-$V_T$ state by a positive reference pulse ($V_{P,ref}$); then, a negative gate pulse is applied. As the negative gate pulse amplitude $V_N$ increases, the FeFET's $V_T$ state monotonically increases, as experimentally shown in FIG. 2*a*. Another example of gate voltage pulse scheme to monotonically increase the $V_T$ state is to apply negative gate pulses with increasing pulse width $t_P$ and/or increasing number of negative pulses.

FIG. 2*a* shows only an example of few transfer characteristics. However, the $V_T$ tuning can be made indefinitely fine and gradual by properly adjusting the successive amplitudes, widths and/or number of applied pulses.

Figure 3:
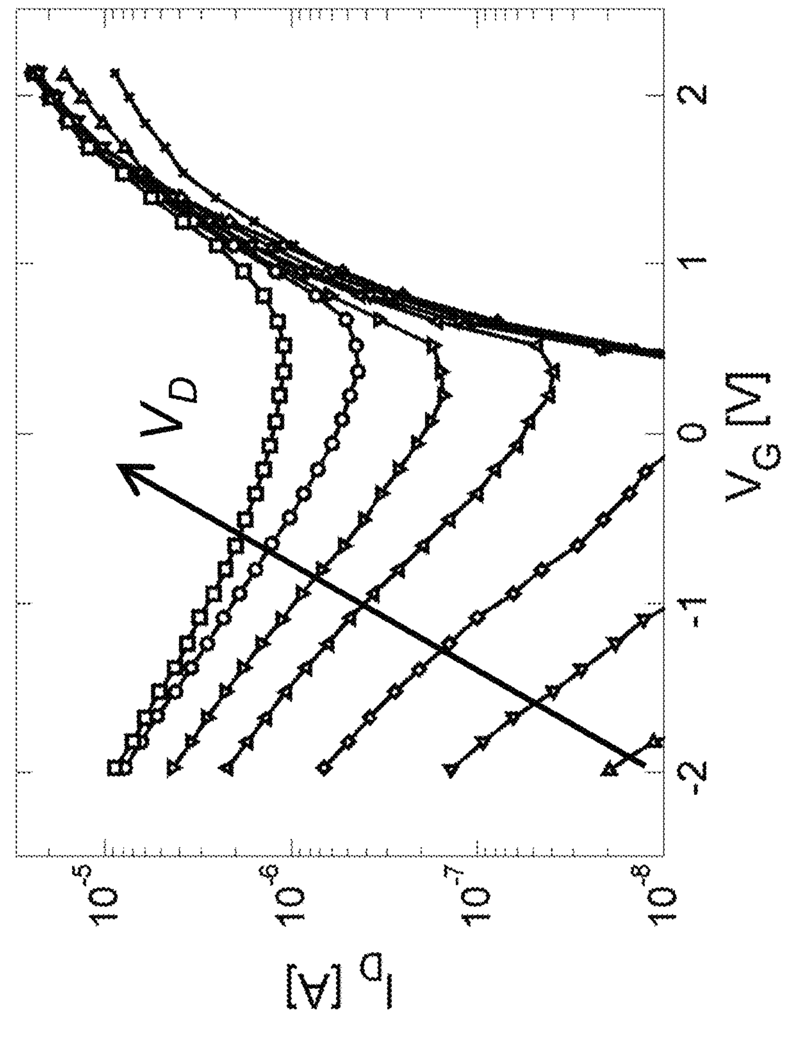
FIG. 3 illustrates the increase of a gate-induced drain leakage in a FeFET as a drain bias increases.

FIG. 3 shows a family of transfer characteristics of a FeFET set into low-$V_T$ state for different drain voltage values $V_D$ in a semi-log plot. The drain current $I_D$ increases as the drain voltage increases and the gate voltage $V_G$ becomes more negative, i.e. the drain-to-gate voltage increases. This is caused by the band-to-band tunneling at the gate-to-drain overlap region.

Generally, upon a sufficient potential difference between the gate and the drain terminals that induces a very strong band bending in silicon, a band-to-band tunneling process in the gate-to-drain overlap region takes place. As a consequence, a current can be sensed at the drain, which originates from the tunneling of valence-band electrons into the conduction band. This current is typically termed gate-induced drain leakage (GIDL), since it represents an undesired source of leakage in logic transistors. The tuning of GIDL current can be made indefinitely fine and gradual by properly adjusting the drain voltage. Moreover, the GIDL current levels can be modulated by varying the fabrication process: e.g. by changing the doping at the drain, the extension of the gate-to-drain overlap region etc.

The GIDL current may be further modulated by changing the steepness of the sidewalls of the ferroelectric material or the amount of the ferroelectric phase overlapping with drain. This may induce polarization-dependent GIDL current, i.e. the GIDL branch will depend on the stored $V_T$ state as well.

The tuning of the threshold voltage by the partial polarization switching in a FeFET and the tuning of the GIDL drain current by electrically adjusting the drain voltage $V_D$ will be exploited in this disclosure to shape the transfer curve of a FeFET for the purpose of frequency doubling.

Figure 4A:
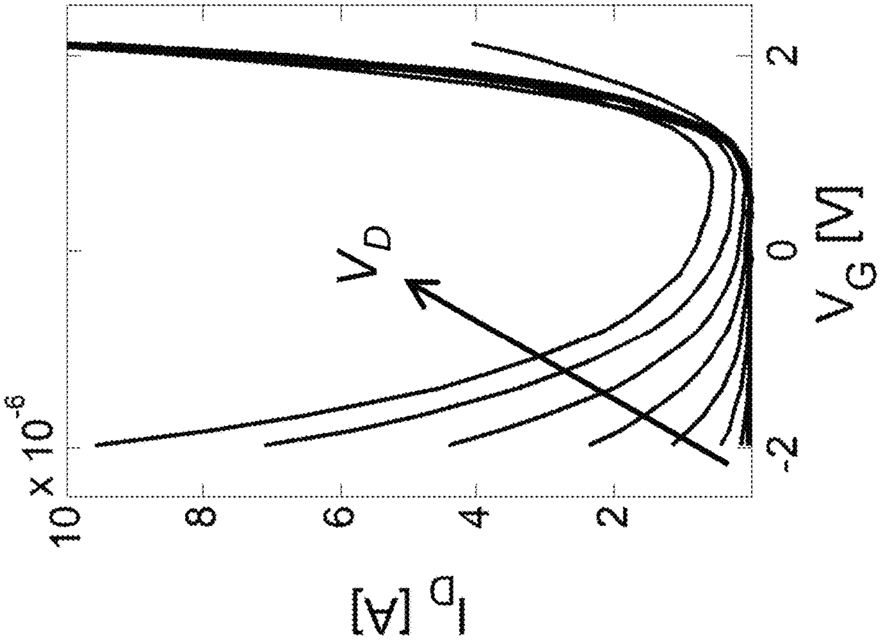
FIG. 4*a* illustrates in a linear plot a gradual tuning of a parabolic shape of a FeFET's transfer curve by increasing the drain voltage with the threshold voltage fixed.

FIG. 4*a* shows a family of experimental transfer characteristics of a FeFET at a fixed $V_T$ state for different drain voltages $V_D$ in a linear plot. As $V_D$ increases, the shape of the transfer characteristics becomes progressively parabolic or "V"-shaped. The drain current $I_D$ is always positive for both negative and positive gate voltages $V_G$. Therefore, the FeFET has a rectifying behavior. Moreover, FIG. 4*a* also shows that the negative branch of the transfer characteristics can be gradually and arbitrarily tuned by varying the drain voltage $V_D$. With increasing drain voltage $V_D$ the increase of the drain current $I_D$ is much steeper and happens at lower negative gate voltages $V_G$.

Figure 4B:
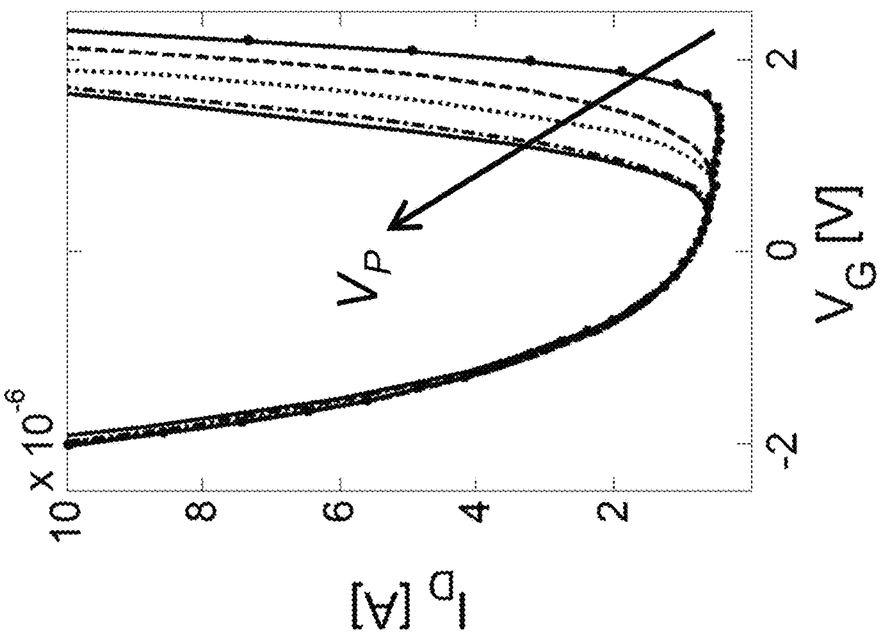
FIG. 4*b* illustrates in a linear plot a gradual tuning of the parabolic shape of a FeFET's transfer curve by decreasing the threshold voltage upon positive program pulses $V_P$, with the drain voltage fixed.

FIG. 4*b* shows a family of experimental transfer characteristics of a FeFET at a fixed drain voltage for different $V_P$ values of the applied positive gate pulse, as shown in FIG. 2*b*. The shape of the positive branch of the transfer characteristics can be gradually and arbitrarily tuned simply by varying $V_P$ or alternatively $V_N$ and/or by changing pulse width $t_P$ and/or number of pulses, as discussed in relation to FIG. 2. By increasing the positive gate voltage $V_P$ the positive branch of the transfer characteristics of the FeFET happens at lower positive gate voltages.

Overall, the symmetry and the width of the parabolic shape of the FeFET's transfer characteristics can be adjusted electrically by varying $V_D$ and/or $V_P$ (or alternatively $V_N$ and/or by changing pulse width $t_P$ and/or number of pulses). Thus, the shape and symmetry of the FeFET's transfer curve can be monotonically tuned by via electrical excitations.

It should be understood that the terms "positive branch" and "negative branch", which are used throughout this invention to refer to the right and the left part of the parabolic transfer characteristic ($I_D$-$V_G$ curve), respectively, are only examples related to the experimental data in FIG. 4. Nevertheless, the center of symmetry, and therefore the position of the parabolic $I_D$-$V_G$ curve can be shifted to negative or positive $V_G$ values depending on the desired application, e.g. by changing the doping of the substrate, work functions, device scaling etc. In that case, the terms "positive branch" and "negative branch" may not be suitable, but other terms like "right branch" or "left branch" may be more appropriate. Nevertheless, the validity of the principles, implementations, embodiments and claims of this invention remains general and unchanged.

Figure 4C:
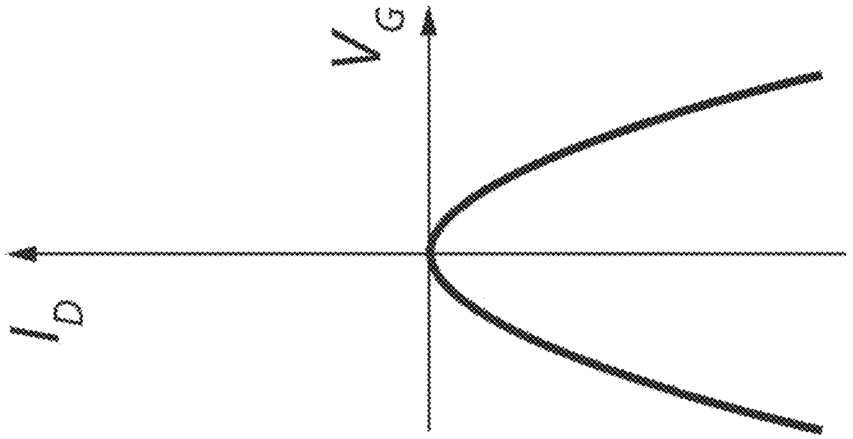
FIG. 4*c* illustrates linear plots of the parabolic shape of a FeFET transfer curve in a case where the drain current is taken as positive and negative values, according to one example.

It should also be understood that different device structures/compositions can have physical phenomena governing the left and right $I_D$-$V_G$ branches inverted with respect to the ones explained in FIGS. 4*a* and 4*b*. For instance, by considering a p-FeFET, i.e. a FeFET having an n-doped substrate, the p-doped source and drain regions and a channel constituted of holes, the left $I_D$-$V_G$ branch will be tuned by the polarization switching (i.e. $V_P$ or $V_N$ pulses), whereas the right branch will be tuned by $V_D$ (i.e. GIDL current). It should also be understood that different device structures/compositions along with different current/voltage sign conventions can be exploited to construct a parabolic $I_D$-$V_G$ curve which is always negative, as shown in FIG. 4*c*, case II. All of these variations are possible implementations of the concepts present by the present disclosure.

By superimposing a sinusoidal signal of frequency $f_{in}$ on the gate dc bias, for which the device is at the minimum conduction point, the drain current will display a signal whose fundamental frequency is double the frequency at the input, as schematically depicted in FIG. 5*a* to FIG. 5*d*. In fact, due to the rectifying behavior, both the positive and the negative input semi-cycles will result in positive drain current semi-cycles, so that each semi-cycle swing of the input signal will correspond to a full-cycle swing of the output signal.

Figure 5A:
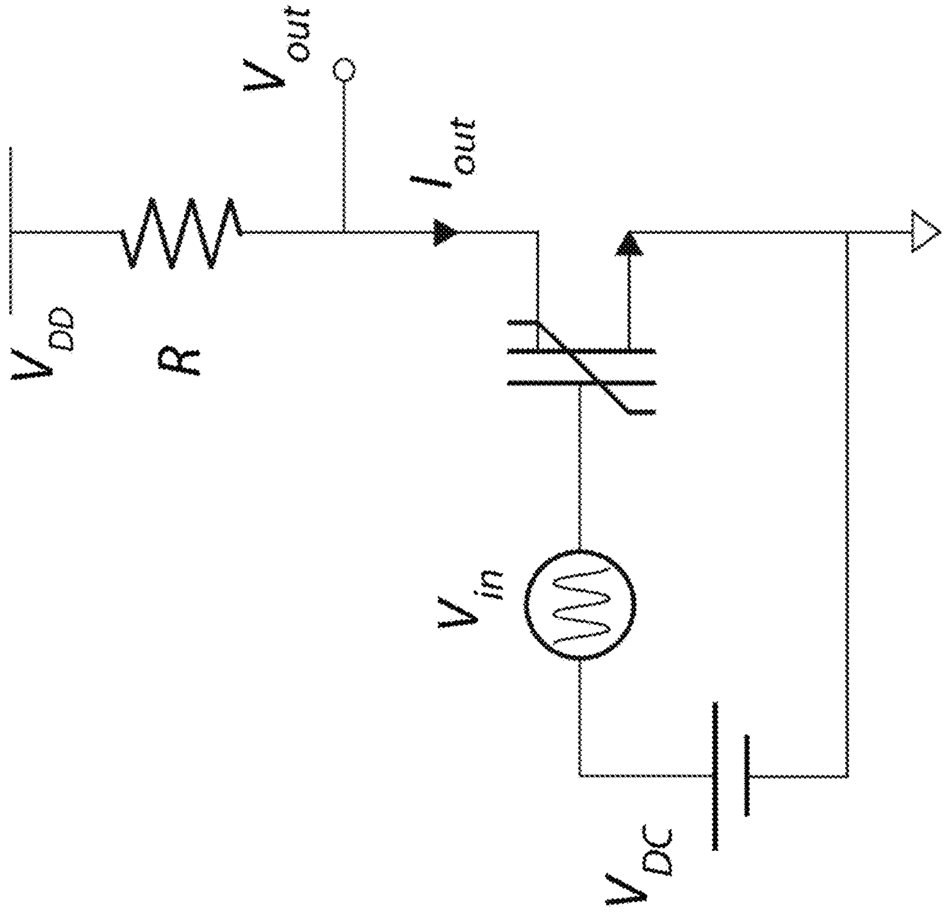
FIG. 5*a* is a schematic diagram illustrating an example of an electrical configuration for frequency doubling.

FIG. 5*a* shows one example of an electrical set-up to implement frequency doubling. As illustrated, a dc bias $V_{DC}$ and a sinusoidal signal $V_{in}$ are applied at the gate of a FeFET, which produce an output current $I_{out}$ flowing through a load resistor R. $V_{DD}$ is a supply voltage to be applied to the load resistor in order to properly bias the drain terminal of the FeFET. The drain voltage $V_D$ is given by $V_D = V_{DD} - R \cdot I_{out}$. The resulting output voltage $V_{out}$ is sensed, which may be possibly dc-filtered by a capacitor C. For the purpose of frequency doubling, the FeFET is configured with a symmetric and rectifying transfer characteristic, such as described by FIG. 4.

Figure 5B:
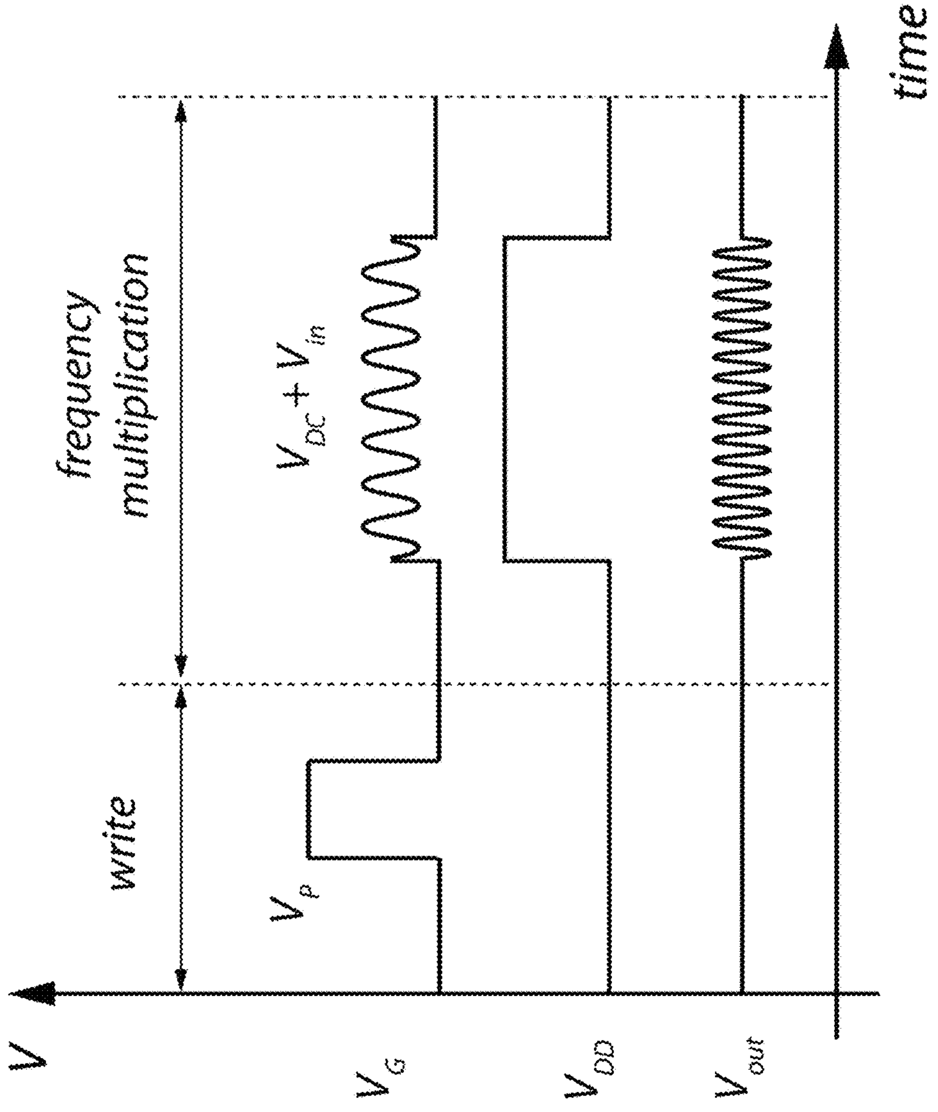
FIG. 5*b* illustrates a time flow of signals applied to a FeFET to perform frequency doubling, according to one example.

FIG. 5*b* illustrates a timing diagram of signals to be applied to the FeFET to perform frequency doubling, according to one example. A first stage is referred to as "Write", which includes programming the FeFET to a desired $V_T$ state (i.e. to achieve a desired symmetric $I_D$-$V_G$ shape). In one example, this is carried out by applying a write pulse at gate $V_G$, as described in FIG. 4. In examples, this can be either a positive ($V_P$) pulse or a negative ($V_N$) pulse with a suitable pulse width $t_P$ or a number of consecutive pulses. A second stage is referred to as "Frequency Multiplication", where simultaneously a dc signal $V_{DC}$ (to bias the FeFET at the minimum conduction point) and a sinusoidal signal $V_{in}$ (to be frequency-doubled) are applied at the gate, along with a proper $V_{DD}$. The output $V_{out}$ result is frequency-doubled.

Figure 5C:
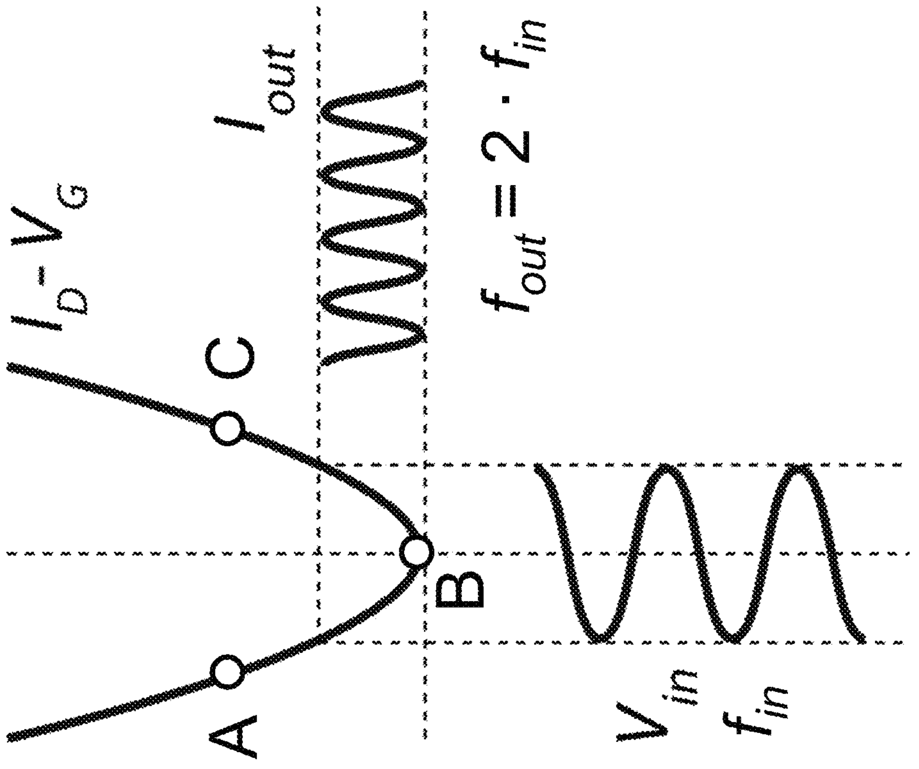
FIG. 5*c* illustrates the principal of frequency doubling based on a parabolic-shaped transfer characteristic of a FeFET, according to one example.
Figure 5D:
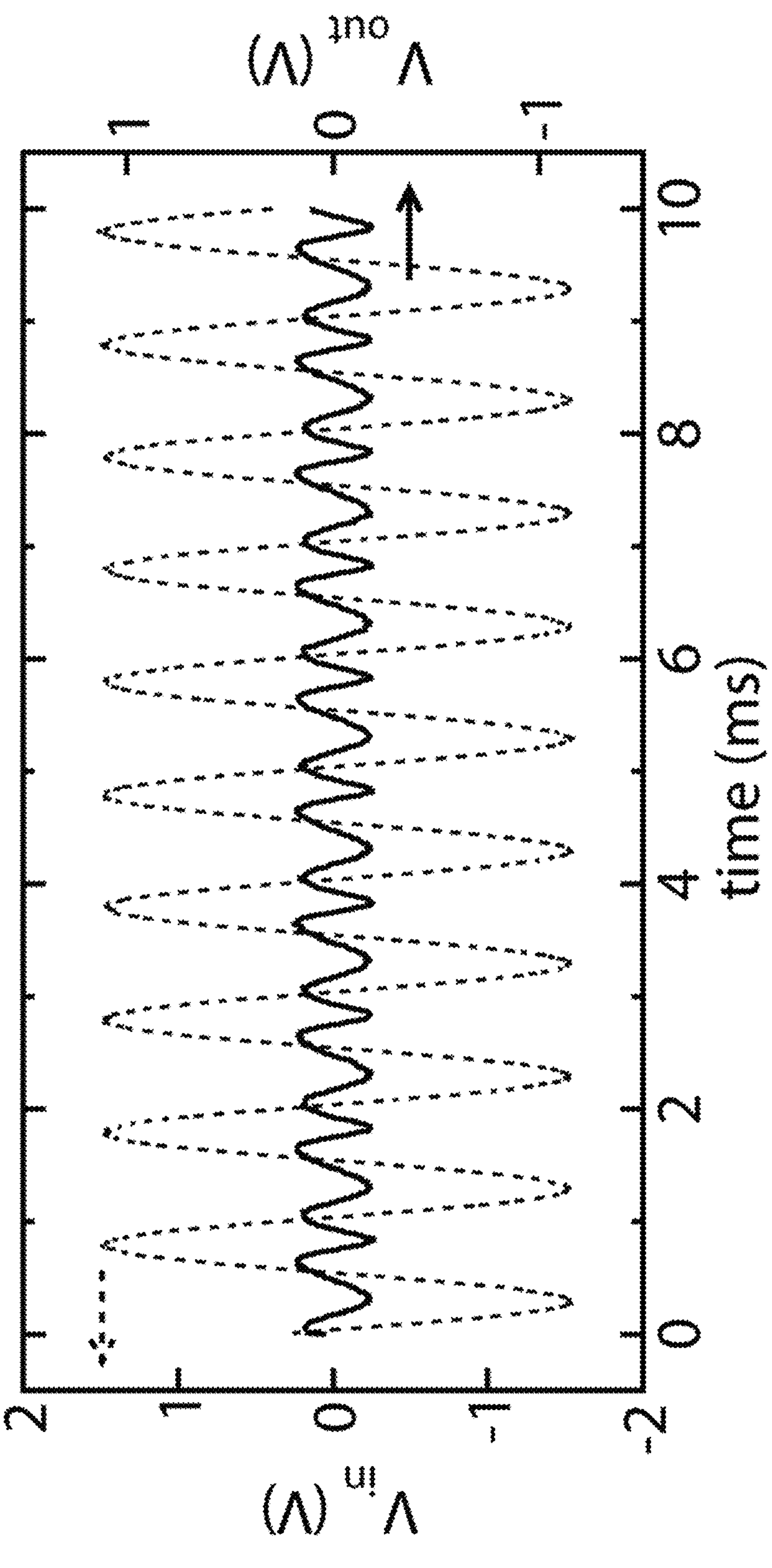
FIG. 5*d* shows an experimental demonstration of frequency doubling at output waveform $V_{out}$ upon feeding input sinsoid $V_{in}$ into the set-up of FIG. 5*a*, according to one example.

FIG. 5*c* shows that by dc biasing a FeFET at its minimum conduction point, indicated by the letter (B) of its parabolic transfer characteristics $I_D$-$V_G$, and by superimposing a sinusoidal waveform of frequency $f_{in}$ thereon, the resulting output fundamental frequency will be $f_{out}=2\cdot f_{in}$. This is due to the fact that the input sinusoid experiences a full-wave rectification. It is noted that FIG. 5*c* shows an experimental demonstration where $f_{in}$=1 kHz and $f_{out}$=2 kHz. It is noted that point B is referred to herein as the "inflection point" of the parabolic-shaped transfer characteristic, where a gate voltage corresponding to the inflection point is referred to as the "inflection point gate voltage", $V_{IPG}$ (see also FIG. 6*a* and FIG. 7*a*). Although the transfer characteristic may not be perfectly parabolic, the inflection point may also be referred to as a "center of symmetry" or as a "vertex", for example.

With reference to FIG. 5*c*, by dc biasing a FeFET at a voltage point of its parabolic transfer characteristic different from B, and by superimposing a sinusoidal waveform of frequency $f_{in}$, the resulting output fundamental frequency will be $f_{out}=f_{in}$, i.e. the frequency doubling does not occur. This other dc operating point has to satisfy three conditions: i) it is not the minimum conduction point B; ii) it can be either on the negative (point A) or on the positive branch (point C) of the transfer characteristics; iii) the absolute distance between the voltage points A or C and B is greater than or equal to the amplitude of the superimposed sinusoidal. Therefore, the method of frequency doubling is electrically reconfigurable in that it can be activated (turned on) by selecting the dc bias to correspond to point B, or be suppressed (turned off) by selecting the dc bias to correspond to point A or point C.

Figure 6A:
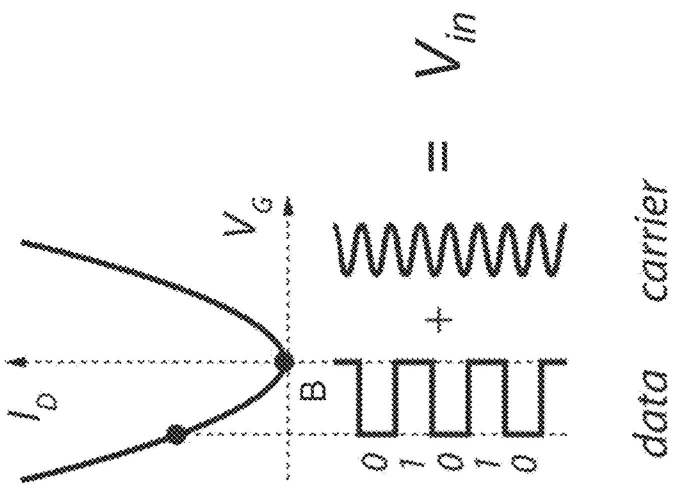
FIG. 6*a* shows the principle of one example of a binary frequency-shift keying scheme implemented using a FeFET, by feeding a data waveform and a carrier signal at the gate.
Figure 6B:
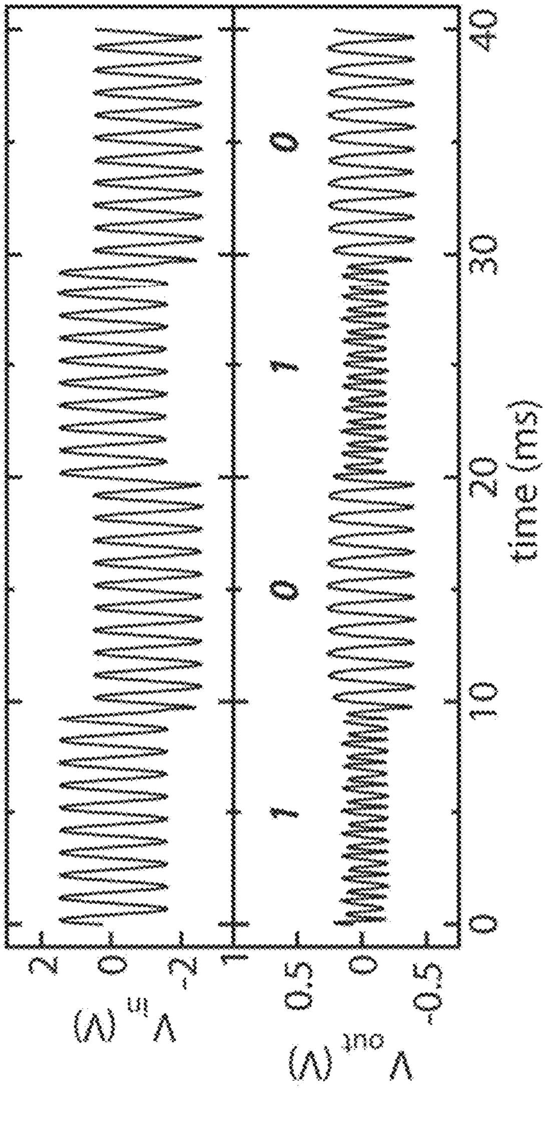
FIG. 6*b* shows an experimental demonstration using the principle in FIG. 6*a*, according to one example.

The re-configurability of the device achieved by setting different dc bias voltages may be employed for different implementations. For example, one such implementation is binary frequency-shift keying, which is a particular case of the pervasively adopted frequency modulation technique employed in telecommunication systems and data processing. FIG. 6*a* and FIG. 6*b* show an example implementation of binary frequency-shift keying (FSK) using a FeFET as described herein.

The FeFET is configured to have a symmetric and rectifying transfer characteristics, as discussed in FIG. 4. FSK is a particular implementation of frequency modulation scheme used in telecommunication systems. The binary FSK uses a pair of discrete frequencies to transmit binary ones (1s) and zeros (0s). To this purpose, the data (stream of 1s and 0s) modulates the carrier sinusoid of a constant frequency to obtain and transmit a modulated signal having two discrete frequencies encoding 1s and 0s.

In FIG. 6*a*, the data stream of 1s and 0s is represented by a square waveform, where the 1 corresponds to the gate voltage at the minimum conduction point of the FeFET's transfer characteristic, and the 0 corresponds to a negative gate voltage at the negative branch of the transfer characteristics. In this way, by superimposing the carrier sinusoidal waveform of frequency $f_{in}$, the resulting output voltage $V_{out}$, as indicated in the set-up in FIG. 5*a*, will have frequency $f_{out}=2\cdot f_{in}$ for data=1 and $f_{out}=f_{in}$ for data=0. This is a direct consequence of the reconfigurable frequency doubling shown in FIG. 5. FIG. 6*b* shows an experimental implementation of this binary FSK by using a FeFET. $V_{in}$ represents a signal given by data+carrier. $V_{out}$ is the output voltage as indicated in FIG. 5*a*.

Figure 7A:
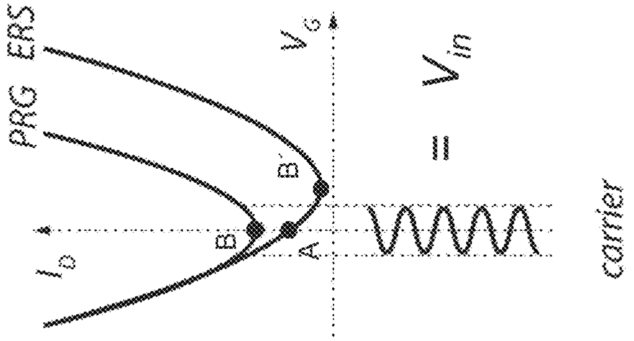
FIG. 7*a* shows the principle of one example of a binary frequency-shift keying scheme implemented with a FeFET, by feeding a carrier signal at the gate, where the logical data 1 and 0 are encoded by the low and high threshold voltage state of the FeFET.
Figure 7B:
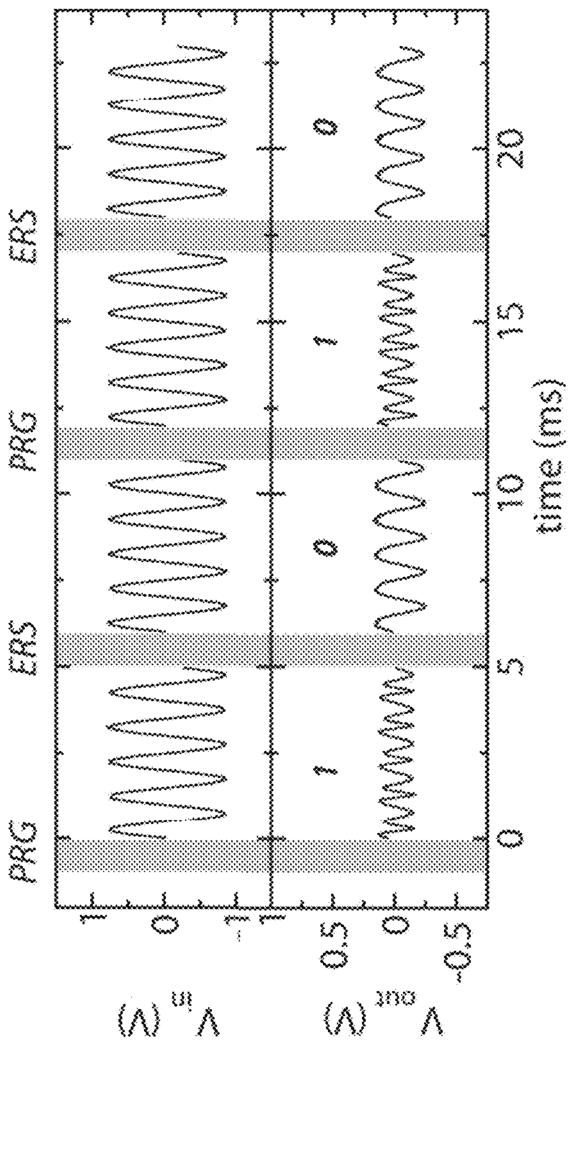
FIG. 7*b* shows an experimental demonstration using the principle in FIG. 7*a*, according to one example.

FIG. 7*a* and FIG. 7*b* show another example implementation of the binary FSK. Here, the FeFET is switched in its low-$V_T$ state and high-$V_T$ state to encode the binary 1 and the binary 0, respectively. FIG. 7*a* shows that FeFET is dc biased at the minimum conduction point (B) relative to its low-$V_T$ state, which does not correspond to the minimum conduction point (B') relative to the high-$V_T$ state, as shown by the two different $I_D$-$V_G$ curves, PRG (programmed) and ERS (erased), respectively. It is noted that point (B) corresponds to the inflection point gate voltage, $V_{IPG}$, of parabolic-shaped transfer characteristic curve PRG, and that point (B') corresponds to the inflection point gate voltage, $V_{IPG}'$, of shifted parabolic-shaped transfer characteristic curve ERS. When a carrier sinusoidal waveform of frequency $f_{in}$ is applied to such a FeFET, the resulting output voltage $V_{out}$ will have the fundamental frequency $f_{out}=2\cdot f_{in}$ only if the device is in low-$V_T$ state. The high $V_T$ state will, instead, transmit the input frequency to the output $f_{out}=f_{in}$. FIG. 7*b* shows an experimental implementation of this binary FSK by using a FeFET. $V_{in}$ represents the carrier. $V_{out}$ is the output voltage as indicated in FIG. 5*a*.

FIG. 7 also shows that the frequency doubling can be made reconfigurable not only by changing the dc bias at the symmetric transfer characteristics, as discussed above, but also by setting the device into low-$V_T$ or high-$V_T$ while keeping the dc bias constant. Thus, the multiplication functionality of the polarizable material of the device is switched on or off depending on the polarization state of the polarizable material. In fact, as shown in FIG. 7*b*, the low-$V_T$ state will induce frequency doubling, whereas the high-$V_T$ state will induce the transmission of the input frequency to the output without doubling, even if the identical input signal superimposed to the identical dc bias was applied to the same FeFET device.

Figure 8:
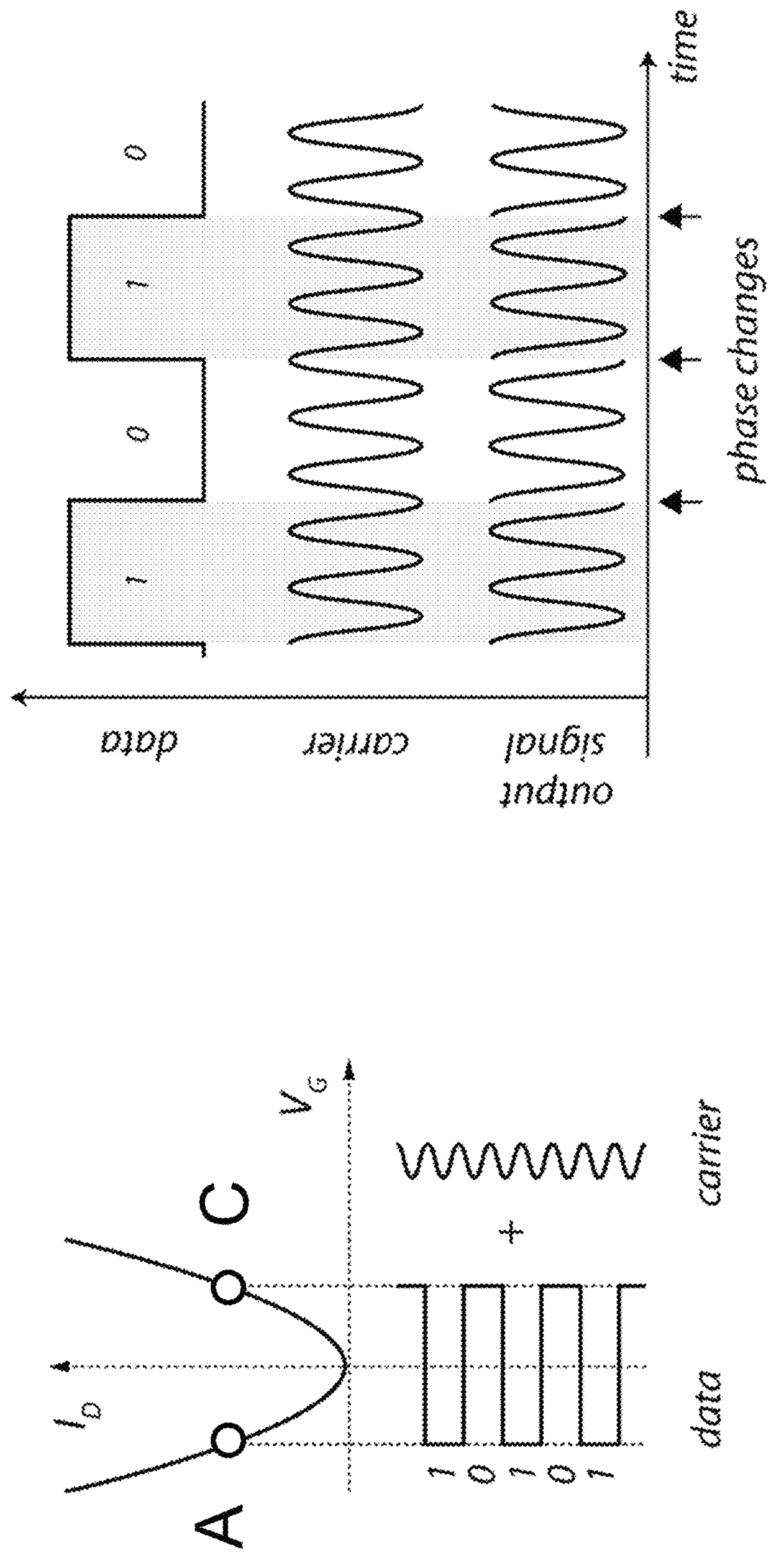
FIG. 8 shows the principle of one example of the binary phase-shift keying scheme implemented with a FeFET, by feeding the data waveform (1s and 0s) and the carrier signal at the gate, where the logical data 1 and 0 are encoded by the signal phases shifted by 180-degrees.

The symmetric transfer characteristics of the FeFET can be used to implement other data transmission schemes used in telecommunications. One example is the phase-shift keying (PSK) where digital data are represented by discrete phase shifts of the modulated signal. FIG. 8 illustrates one example where a dc bias is applied to the FeFET at points A and C of its $I_D$-$V_G$ transfer characteristic described in FIG. 5*c* to encode 1 and 0 (or vice versa). This is represented by the square pulse waveform (data waveform) in FIG. 8. Consequently, by superimposing the sinusoidal input signal, the corresponding output signals will have the same fundamental frequencies, but with phases shifted by 180°, thus implementing the PSK.

Figure 9:
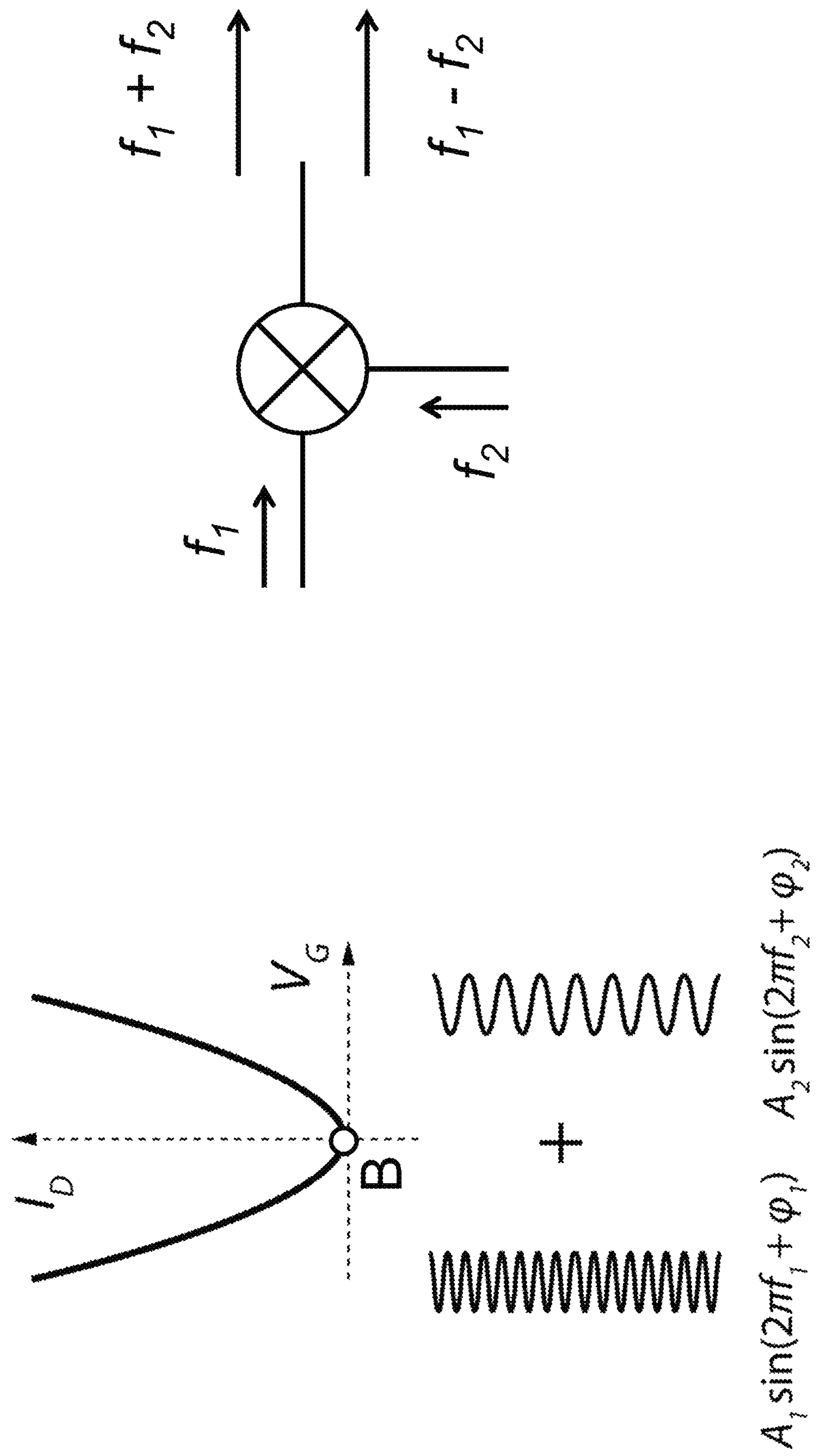
FIG. 9 shows the principal of one example of a frequency mixing scheme implemented with a FeFET, by feeding two sinusoidal inputs with frequencies $f_1$ and $f_2$ at the gate, which results in a sum and a difference of these frequencies at the output.

The symmetric transfer characteristics of the FeFET can be used to implement additional radiofrequency functionalities, such as frequency mixing. FIG. 9 illustrates one example of a FeFET-based frequency mixer. By dc biasing the FeFET at the minimum conduction point B of its $I_D$-$V_G$ transfer characteristic, as described in FIG. 5*b*, and by simultaneously feeding at the gate two sinusoidal inputs having frequencies $f_1$ and $f_2$, the output signal will contain, among other even-order harmonics, very pronounced components of the sum $(f_1+f_2)$ and difference $(f_1-f_2)$. Odd-order harmonics will be largely suppressed at the output.

Although specific embodiments have been illustrated and described herein, it will be appreciated by those of ordinary skilled in the art that a variety of alternate and/or equivalent implementations may be substituted for the specific embodiments shown and described without departing from the scope of the present invention. This application is intended to cover any adaptions or variations of the specific embodiments discussed herein. Therefore, it is intended that this invention be limited only by the claims and the equivalents thereof.

What is claimed is:

1. An integrated circuit element including:

a gate;

a source; and a drain, in response to a selected drain voltage, a drain-current-to-gate-voltage transfer characteristic of the integrated circuit element to transition from an asymmetric, non-linear first transfer characteristic to a non-linear parabolic-shaped second transfer characteristic with an inflection point having a corresponding inflection point gate voltage value, where drain current values of the second transfer characteristic increase in magnitude as gate voltage values both increase and decrease from the inflection point gate voltage value such that the second transfer characteristic is a rectifying transfer characteristic.

2. The integrated circuit element of claim 1, where all drain current values of the second transfer characteristic are greater than zero.

3. The integrated circuit element of claim 1, where all drain current values of the second transfer characteristic are less than zero.

4. The integrated circuit element of claim 1, when having the second transfer characteristic, in response to application of a sinusoidal input voltage signal to the gate, the sinusoidal input voltage signal having an input frequency and being superimposed on a dc offset signal having a value within a selected voltage range of the inflection point gate voltage value, a resulting drain current signal to have an output frequency equal to twice the input frequency such that the integrated circuit element provides a frequency multiplication function.

5. The integrated circuit element of claim 4, the selected voltage range of the dc offset signal being from a lower value to an upper value, the lower value being equal to the inflection point gate voltage minus one-half an amplitude of the sinusoidal input voltage signal, and the upper value being equal to the inflection point gate voltage plus one-half the amplitude of the sinusoidal input voltage signal.

6. The integrated circuit element of claim 5, the frequency multiplication function being turned on and off in response to the value of the dc offset signal being adjusted so as to be within the selected voltage range and outside the selected voltage range.

7. The integrated circuit element of claim 1, the gate including a gate oxide comprising a polarizable material.

8. The integrated circuit element of claim 1, the polarizable material comprising a ferroelectric material.

9. The integrated circuit element of claim 1, the integrated circuit element comprising a FeFET.

10. An integrated circuit element, comprising:

a gate including a polarizable material with a polarization state adjustable over a range of polarization states in response to programming pulses at the gate;

a source; and a drain; in response to a selected bias voltage at the drain, a drain-current-to-gate-voltage transfer characteristic of the integrated circuit element to transition from a first asymmetric transfer characteristic to a second transfer characteristic which is parabolic-like about an inflection point at a corresponding inflection point gate voltage such that the integrated circuit element provides a rectified drain current output signal in response to a sinusoidal gate input voltage signal having a dc offset voltage within a rectifying range, wherein rectification of the drain current output signal is selectively turned off and on in response to programming pulses applied at the gate to adjust the polarization state with the selected bias voltage present at the drain.

11. The integrated circuit element of claim 10, in response to selected programming pulses, the polarization state is adjusted so as to adjust a threshold voltage of the integrated circuit element and shift the second transfer characteristic such the bias voltage is within the rectifying range to turn on rectification of the drain current output signal and outside of the rectifying range to turn off rectification of the drain current output signal.

12. The integrated circuit element of claim 10, the rectifying range of the dc offset voltage having a lower value being equal to the inflection point gate voltage signal minus one-half an amplitude of the sinusoidal gate input voltage signal, and an upper value being equal to the inflection point gate voltage plus one-half the amplitude of the sinusoidal input voltage signal.

13. The integrated circuit element of claim 10, wherein a threshold voltage of the first asymmetric transfer characteristic is adjustable based on the programming pulses.

14. The integrated circuit of claim 10, a voltage magnitude of the programming pulses being greater than a magnitude of the dc bias voltage at the gate.

15. The integrated circuit of claim 14, the programming pulses having a voltage magnitude not less than ten times greater than a magnitude of the dc bias voltage at the gate.

16. The integrated circuit element of claim 10, polarizable material comprising a ferroelectric material.

17. The integrated circuit element of claim 16, the integrated circuit comprising a FeFET.

18. A method of operating an electronic device including a gate, a source, and a drain, the gate including a polarizable material, the method comprising:

applying programming pulses to the gate to adjust a polarization state of the polarizable material to a selected state over a range of polarization states so as to adjust a threshold voltage of the electronic device to a selected value; and applying a bias voltage to the drain to transition a drain-current-to-gate-voltage transfer characteristic of the integrated circuit element from a first asymmetric transfer characteristic to a second transfer characteristic which is parabolic-like about an inflection point at a corresponding inflection point gate voltage.

19. The method of claim 18, including:

with the bias voltage applied at the drain, applying to the gate a sinusoidal input voltage signal having an input frequency and superimposed on a dc offset voltage within a rectifying voltage range to provide a rectified output drain current signal having an output frequency which is twice the input frequency, wherein the rectifying voltage range of the dc offset voltage has a lower value being equal to the inflection point gate voltage minus one-half an amplitude of the sinusoidal gate input voltage signal, and an upper value being equal to the inflection point gate voltage plus one-half the amplitude of the sinusoidal input voltage signal.

20. The method of claim 19, including:

with the sinusoidal input voltage signal applied at the gate, turning the rectification on and off by applying programming pulses to the gate to adjust the polarization state to shift the second transfer characteristic such that the dc offset voltage is outside of the rectifying voltage range of the shifted transfer characteristic to turn off the rectification and inside the rectifying voltage range to turn on the rectification.

21. The method of claim 19, including:

with the sinusoidal input voltage signal applied at the gate, turning off the rectification by adjusting the dc offset voltage to be outside the rectifying voltage range, and adjusting the dc offset voltage to be within the rectifying voltage range to turn on the rectification.

* * * * *